(12) United States Patent
Moldwin et al.

(10) Patent No.: US 10,782,135 B2
(45) Date of Patent: Sep. 22, 2020

(54) MAGNETIC BEACON AND INERTIAL SENSOR LOCALIZATION TECHNOLOGY

(71) Applicant: The Regents of The University of Michigan, Ann Arbor, MI (US)

(72) Inventors: Mark B. Moldwin, Ann Arbor, MI (US); Lauro V. Ojeda, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 47 days.

(21) Appl. No.: 16/092,677

(22) PCT Filed: Apr. 10, 2017

(86) PCT No.: PCT/US2017/026778
§ 371 (c)(1),
(2) Date: Oct. 10, 2018

(87) PCT Pub. No.: WO2017/180503
PCT Pub. Date: Oct. 19, 2017

(65) Prior Publication Data
US 2019/0170516 A1 Jun. 6, 2019

Related U.S. Application Data

(60) Provisional application No. 62/320,697, filed on Apr. 11, 2016.

(51) Int. Cl.
*G01B 7/14* (2006.01)
*G01C 21/16* (2006.01)
(Continued)

(52) U.S. Cl.
CPC .......... *G01C 21/165* (2013.01); *G01R 33/02* (2013.01); *G01S 1/68* (2013.01); *H04W 64/00* (2013.01)

(58) Field of Classification Search
CPC ...... G01R 33/02; G01C 21/005; G01C 21/08; G01C 21/165; G01C 21/206;
(Continued)

(56) References Cited

U.S. PATENT DOCUMENTS 6,549,004 B1 4/2003 Prigge
8,751,151 B2 6/2014 Funk et al.
(Continued)

FOREIGN PATENT DOCUMENTS

EP 2602590 A1 6/2013
EP 2881708 A1 6/2015
(Continued)

OTHER PUBLICATIONS

International Search Report and Written Opinion of the International Searching Authority issued in PCT/US2017/026778, dated Jul. 19, 2017; ISA/KR.

Primary Examiner — Thang X Le
(74) Attorney, Agent, or Firm — Harness, Dickey & Pierce, P.L.C.

(57) ABSTRACT

A magnetic beacon and inertial sensor system for precise indoor localization is provided using active magnetic beacons, magnetometers and inertial measurement units. The system is designed to work in environments that are not conducive to radio frequency (RF) (such as GPS, cell, Wi-Fi, or Bluetooth) or optical techniques (CCTV, IR), such as inside heavy industrial plant settings, underground or underwater.

16 Claims, 4 Drawing Sheets

(51) Int. Cl.
*H04W 64/00* (2009.01)
*G01S 1/68* (2006.01)
*G01R 33/02* (2006.01)

(58) Field of Classification Search
CPC ............ G01C 21/0263; G01C 21/0289; G01S 5/0027; G01S 5/0081; G01S 19/13; G01S 19/42
See application file for complete search history.

(56) References Cited

U.S. PATENT DOCUMENTS

| | | |
|---|---|---|
| 9,170,124 B2 | 10/2015 | Keene et al. |
| 2008/0036652 A1 | 2/2008 | Shore et al. |
| 2008/0291042 A1 | 11/2008 | Soares, Jr. |
| 2013/0131972 A1* | 5/2013 | Kumar ................. G01C 21/165 701/409 |
| 2013/0177208 A1 | 7/2013 | Haverinen |
| 2014/0155098 A1* | 6/2014 | Markham ............. H04B 1/0064 455/456.3 |
| 2014/0171107 A1 | 6/2014 | Kao et al. |
| 2014/0239943 A1 | 8/2014 | Sheinker et al. |
| 2015/0119086 A1 | 4/2015 | Mirowski et al. |
| 2016/0245638 A1* | 8/2016 | Sheinker .............. G01C 21/005 |
| 2017/0082725 A1* | 3/2017 | Haverinen ............ H04W 4/025 |
| 2017/0242427 A9* | 8/2017 | High .................... B62B 5/0076 |
| 2018/0038937 A1* | 2/2018 | Afzal .................... G01S 5/0226 |
| 2019/0174261 A1* | 6/2019 | Kostka .................. H04W 4/30 |
| 2019/0342697 A1* | 11/2019 | Morgan ................ H04W 16/32 |

FOREIGN PATENT DOCUMENTS

| | | | |
|---|---|---|---|
| WO | 2013165391 | A1 | 11/2013 |
| WO | 2014123707 | A1 | 8/2014 |

\* cited by examiner

MAGNETIC BEACON AND INERTIAL SENSOR LOCALIZATION TECHNOLOGY

CROSS-REFERENCE TO RELATED APPLICATIONS

This application is a U.S. National Phase Application under 35 U.S.C. 371 of International Application No. PCT/US2017/026778 filed on Apr. 10, 2017, which claims the benefit of U.S. Provisional Application No. 62/320,697, filed Apr. 11, 2016. The entire disclosures of the above applications are incorporated herein by reference.

GOVERNMENT INTEREST

This invention was made with government support under AGS-1265651 awarded by the National Science Foundation. The government has certain rights in the invention.

FIELD

The present disclosure relates to beacon and inertial sensor localization technology.

BACKGROUND AND SUMMARY

This section provides background information related to the present disclosure which is not necessarily prior art. This section also provides a general summary of the disclosure, and is not a comprehensive disclosure of its full scope or all of its features.

The field of indoor localization, mapping, and navigation is rapidly developing and has a wide number of commercial players (including Google, Apple, Microsoft, Motorola etc.) using a wide-variety of technologies (most often radio frequency (RF) technologies like Bluetooth, Wi-Fi, ultra-wide band, and Cellular). The focus of these efforts is primarily localization for retail applications (e.g., store and mall navigation and tracking information for customer analytics). However there are other large customer segments that have significant need for localization information where their environments and requirements pose tremendous challenges for current RF localization techniques. High-risk workers work in environments that are not conducive to radio frequency (RF) (such as GPS, cell, Wi-Fi, or Bluetooth) or optical techniques (CCTV, IR), such as inside heavy industrial plant settings, underground or underwater. Workplace safety and security requirements in such environments can be increased by alerting security or first-responder personnel for presence in high-risk area and by locating individuals quickly in an emergency situation. Therefore, localization technology that can help locate high-risk workers, contractors, and security personnel for safety and security reasons in high-electromagnetic noise and industrial machine cluttered environments has the potential to impact the Magnetic Wearable Sensors Market.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
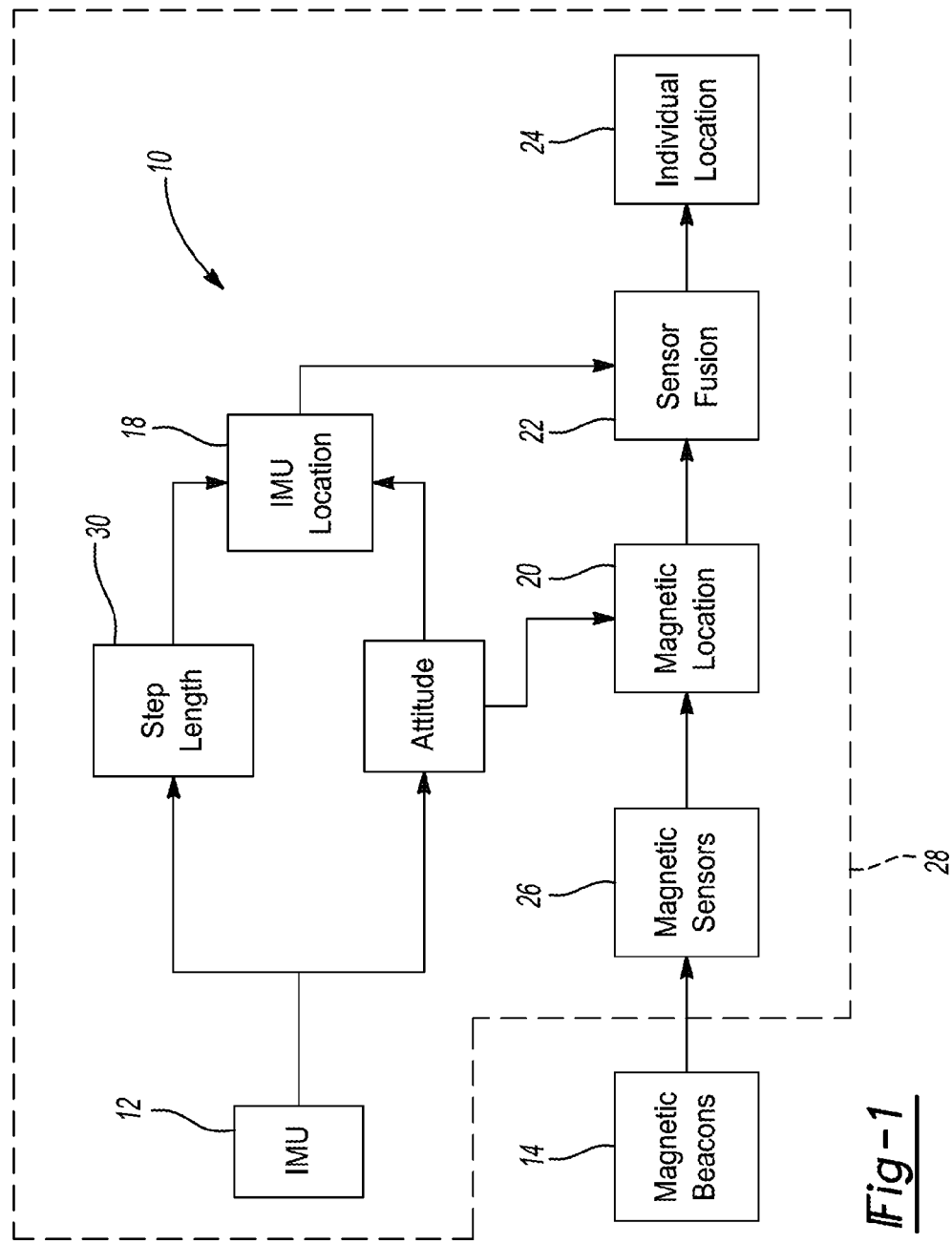
FIG. 1 is a block diagram of the magnetic beacon and inertial sensing technology according to the principles of the present teachings.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

According to the principles of the present teachings, a magnetic beacon and inertial sensor (MBIS) system 10 is provided having advantageous construction and method of use. The MBIS system 10 employs inertial measurement units 12 (IMUs) in connection with indoor floor-map-based navigation. MBIS system 10 permits precise (<1 m), real-time (>1 Hz) location data to individuals for indoor navigation and/or situations where GPS signal may not be available.

In some embodiments, the implementation of MBIS system 10 involves the installation of one or more magnetic beacons 14 in key points inside buildings or other areas intended for navigation. For example, in some embodiments, magnetic beacons 14 can be placed in entryways and hallway intersections. Each magnetic beacon 14 generates a specific, unique, discrete magnetic signature that is referenced to its floor-map location. This enables a receiver, such as a magnetometer 16, carried and/or operated by an operator or other device to detect and recognize the unique signature of the magnetic beacon 14 and hence determine self-localization relative to the floor-map.

Between receiving the specific, unique, discrete magnetic signature of the magnetic beacons 14, the IMUs 12 provide accurate relative location measurements. The period of time upon which location is predicated on IMUs 12 depends on the quality and/or quantity of the IMU. IMUs 12 can be used between accurate magnetic beacon localization and simultaneous therewith. Once the IMU location solution 18 is fused with the magnetic beacon location 20 at 22, the combined solution 24 provides continuous absolute location even when the subject moves between networks of magnetic beacon 14. The two sensor technologies (i.e. IMU and magnetic beacon) work complementary to each other.

Other technologies have been proposed for indoor location determination (cameras, Bluetooth, Wi-Fi, RFID, passive magnetic sensing, active magnetic sensing etc.); however, many of these techniques require a line-of-sight (LOS), are easily influenced by environmental and lighting conditions, and are often proximity detectors opposed to true localization technologies. The MBIS system 10, which combines the benefits of magnetic beacons and an inertial measurement unit (IMU), which includes gyroscopes and accelerometers, significantly improves localization accuracy of the magnetic sensor and decreases significantly the number of magnetic beacons required for continuous and accurate location data.

IMUs, and in particular the recently developed inexpensive MEMS IMUs, suffer from sensor drift errors, which do not allow long-term stability needed for navigation. The magnetic beacons 14 installed at critical locations are used to limit the influence of IMU sensor drift errors, enabling continuous location determination with significantly improved localization accuracy over other assisted IMU technologies.

Existing techniques that make use of magnetic heading and fusion of magnetic heading together with IMUs rely on the Earth's magnetic field for navigation. Because the earth magnetic field is easily influenced by man-made structures, some techniques exploit the uniqueness of the magnetic anomalies inside buildings to associate locations to specific magnetic conditions that have been pre-determined. Other works propose the utilization of DC magnetic markers. In contrast, the present teachings employ active beacons that generate low frequency magnetic fields, benefiting from low environmental noise background at those frequencies. In addition, the quasi-static magnetic field is less influenced by interferences from nearby objects with magnetic content that plagues techniques using the Earth's magnetic field or mapping magnetic anomalies inside buildings.

Figure 9:
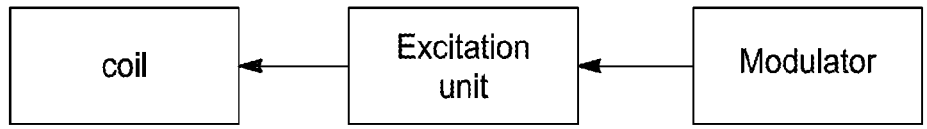
FIG. 9 shows the basic schematic of the magnetic beacon technology.

With particular reference to the present teachings, in some embodiments, MBIS system 10 comprises essentially four components: (1) magnetic beacons 14; (2) an integrated magnetometer and IMU 12, (3) an algorithm shown at 20 to precisely locate the sensor package with respect to a map that has beacon location information, and (4) an algorithm executed at 22 that combines the magnetic location solution with the one estimated using the IMU. To enable precision location capabilities, individuals will need to be equipped with the magnetic sensor and IMU 12 and magnetic beacons 14 will need to be installed and their location and frequency recorded into a map. FIG. 9 depicts the basic schematic of the magnetic beacon technology. The beacons 14 are comprised of a copper coil that generates the magnetic field, a current driver or excitation unit that provides the current feeding the coil, and a frequency modulator that controls the current driver producing the unique signature.

The magnetic beacon technology of the present teachings has been completed for magnetic beacon localization and indoor personal localization using smartphone magnetometers. The localization technology for indoor application requires the development of magnetic beacons that can be easily integrated into buildings and the fusion of the magnetic beacon localization technique with IMU data. Our system consists of the magnetometer sensor 26 and IMU 12 that would be integrated into a small sensor package, such as a portable integrated magnetometer and inertial measurement unit (PIMIMU) device 28, that can be worn by an individual or a resource of interest, and magnetic beacons 14 that would be installed in the building to existing power lines.

Figure 2:
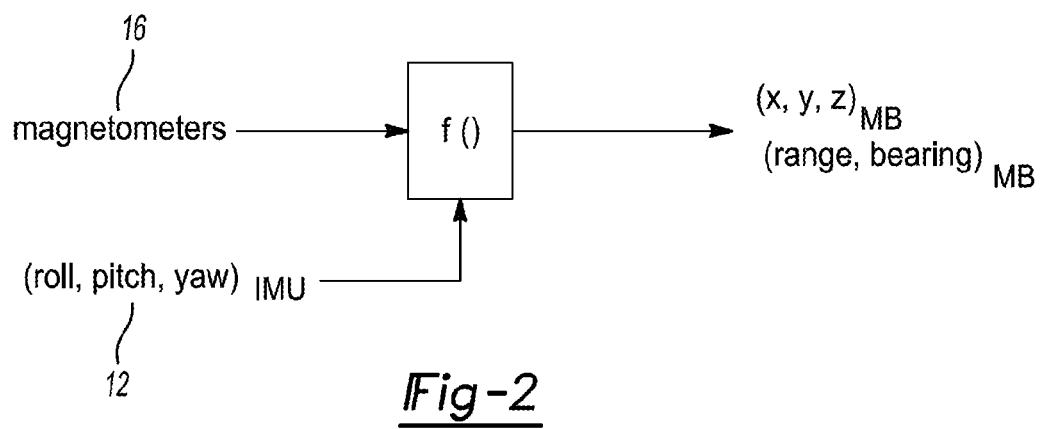
FIG. 2 is magnetic location estimated using magnetic signals. When the attitude of the sensor is known, the algorithm can measure range and bearing from a single coil.

The basic idea of magnetic beacon localization is the sensing of low-frequency (few Hz (i.e. 1 Hz) to 1000 s of Hz (i.e. 10,000 Hz) range) magnetic signals from magnetic beacons 14 that are placed in known locations relative to a map. The location data "initializes" or provides "ground truth" to the IMU 12 that coupled with building information allows the continuous tracking of the individual. At key entry points and intersections, the location of the individual is "fixed" allowing the constant updating of the IMU 12. Precision localization is determined through "triangulation" of the beacon intensity from beacons 14 at known and fixed locations. Due to the dipole nature of the signal strength (intensity is dependent on distance and azimuth) only two beacons are needed to localize the detector relative to the beacons 14. The system can determine the direction and distance to a single beacon 14 when attitude information is available (see FIG. 2). Less precise location information can be obtained from a single beacon if used as a proximity detector (similar to other RF technologies).

Figure 3:
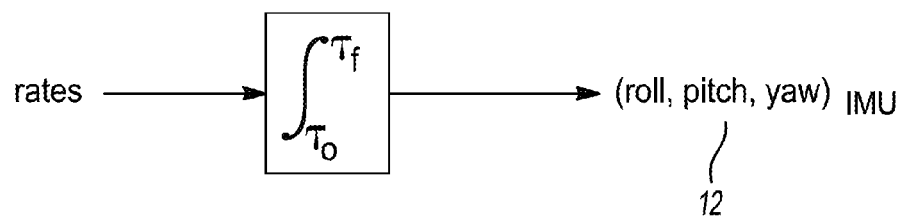
FIG. 3 is attitude estimation using gyroscope rates.

The gyroscope data have to be integrated over time to estimate attitude (roll, pitch and yaw) as shown in FIG. 3.

Figure 4:
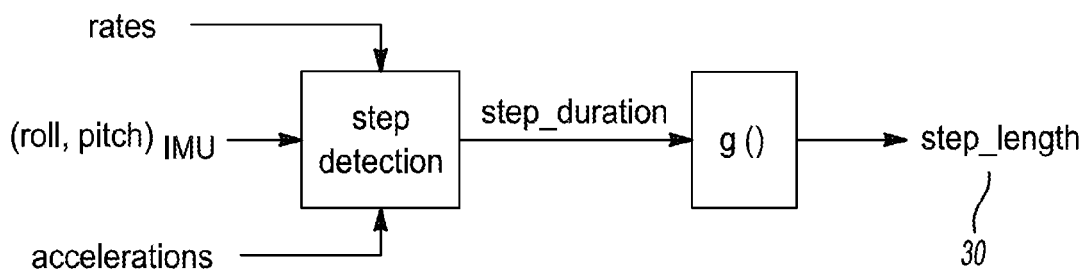
FIG. 4 is IMU information used to detect the step duration and step length.

The cyclic nature of walking will be used to identify when the steps occur. For a given individual, the duration of the step can be associated to a step length 30 (see FIG. 4).

Figure 5:
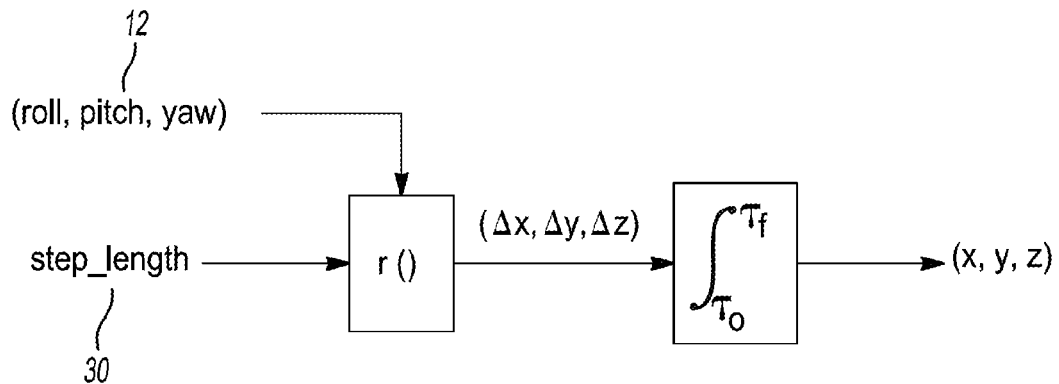
FIG. 5 shows position estimation using attitude and step length.

The step length can be rotated using the attitude information in order to obtain displacements in the world coordinate frame. These displacements can then be integrated to estimate relative location with respect to the starting position (see FIG. 5).

Figure 6:
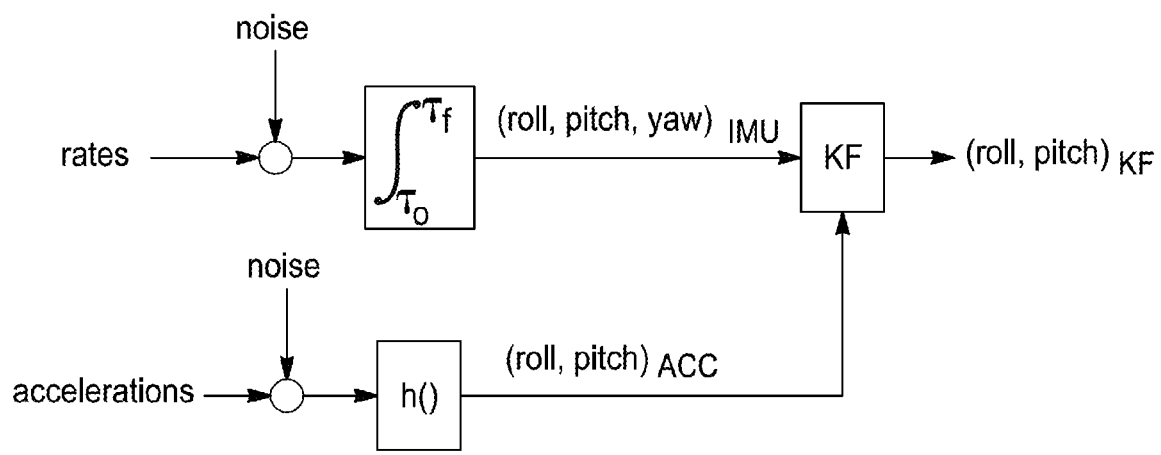
FIG. 6 shows tilt correction using a Kalman filter that integrates gyro attitude and tilt estimated from accelerometer readings.

In the practice however, attitude will drift over time because of the different sources of error that affect IMUs (e.g., bias instability). Fortunately, during steady state (stationary periods or constant velocity), accelerometers can be used to estimate tilt (roll and pitch). We use a Kalman filter to correct the gyro-based tilt estimation, using tilt measurement updates from accelerometer readings. For an IMU mounted on the torso, it is unlikely to have true stationary periods, however the tilt estimate can still be used, although higher uncertainty on the measurement updates will have to be used. Fortunately, a Kalman filter can be designed to handle even varying amounts of uncertainty in the measurements (see FIG. 6).

Figure 7:
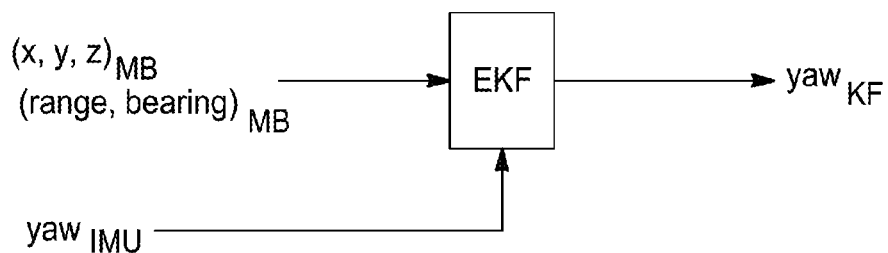
FIG. 7 shows yaw correction using an extended Kalman filter.
Figure 8:
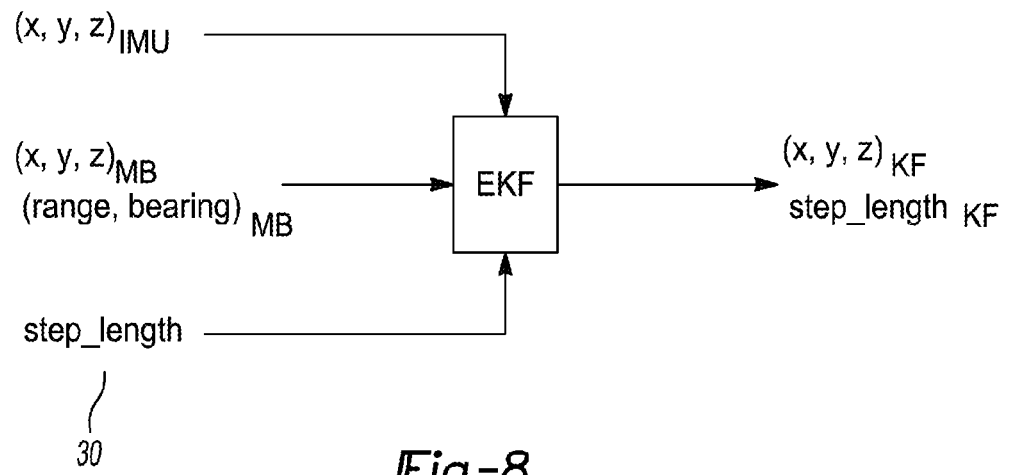
FIG. 8 shows location and step length correction using an extended Kalman filter.

The tilt corrections will have little or no effect in the heading estimation, which will be free to drift. Fortunately heading is indirectly observable from position updates provided by the magnetic beacons. We use an extended Kalman filter to estimate and compensate for heading errors. The extended Kalman filter can be designed to operate either on actual position updates or directly on individual range and bearing information (see FIG. 7). The latter has the advantage of being able to work even if only one beacon is available.

The present teachings provide a number of advantages over competing techniques. (a) In contrast to beacons based on optics, radio or acoustic waves, low frequency magnetic fields do not require line-of-sight (LOS), nor are they influenced by environmental conditions (such as dust or smoke). (b) In contrast to radio waves, low frequency magnetic fields benefit from high penetration ability that limits interference in high congestion situations. (c) Low frequency magnetic fields do not suffer from multi-path interferences, which can severely degrade the localization accuracy of techniques based on radio waves. (d) By fusing IMU with beacon location data, the location of the individual can be determined even far from beacon-instrumented locations. This reduces the number of beacons needed compared to RF (e.g., Bluetooth) or other active sensing localization techniques. (e) No prior mapping of magnetic field anomalies of the area is required. (f) Provides geolocated indoor position of "tagged" workers and security personnel. (g) The combination of magnetic beacon and IMU technology allows large area coverage with a minimum amount of beacon infrastructure. (h) Beacons are connected to fixed electricity with battery backup, as opposed to battery operated. (i) Provides precise (<1 m), real-time position information.

The localization technology of the present teachings would enable high-risk workers (those that work in industrial settings and generally wear protective gear like hardhats, safety glasses, hearing protection etc.) to have their location broadcast to an operations center. This is especially useful for alone workers, workers in confined spaces, or workers in areas that have restricted access due to either heavy equipment traffic or other safety issues (need for other protective clothing etc.). Areas within a facility can have geo-fences installed for individuals alerting them that they are in a high-risk area and in an emergency situation allow security or first-responder personnel to locate individuals quickly. Interviews with several stakeholders in utility settings have indicated significant customer pull to help locate high-risk workers, contractors, and security personnel for safety and security reasons. During the initial customer discovery process we also learned that many other settings (airports, chemical plants, oil refineries, universities) have very similar issues in knowing where security personnel are located.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A magnetic beacon and inertial sensor system comprising:
   a plurality of magnetic beacons each outputting a discrete signal, each of the plurality of magnetic beacons being positioned in a predetermined position within a map;
   a portable integrated magnetometer and inertial measurement unit (PIMIMU) device, the PIMIMU device configured to determine its location and output a location signal based at least in part on the discrete signals; and
   a controller or computing device is configured to determine the location of the PIMIMU device within the map based on information from the plurality of magnetic beacons, the controller further configured to determine the location of the PIMIMU device based on the information from the plurality of magnetic beacons and the location signal and output a location of the PIMIMU device.

2. The magnetic beacon and inertial sensor system according to claim 1 wherein the PIMIMU device is configured to output attitude information and the controller is configured to determine the location of the PIMIMU device based on only one of the plurality of magnetic beacons in conjunction with the attitude information from the PIMIMU device.

3. The magnetic beacon and inertial sensor system according to claim 2 wherein the controller is configured to calculate a step length of an individual based on the attitude information.

4. The magnetic beacon and inertial sensor system according to claim 3 wherein the controller is configured to calculate relative location from a previously known location of the individual based on the attitude information and the step length.

5. The magnetic beacon and inertial sensor system according to claim 2 wherein the controller is configured to calculate relative location from a previously known location of the individual based on the attitude information.

6. The magnetic beacon and inertial sensor system according to claim 2 wherein the controller is configured to calculate a step length of an individual based on the location signal of the PIMIMU device.

7. The magnetic beacon and inertial sensor system according to claim 1 wherein the controller is configured to determine the location of the PIMIMU device based on triangulation of the information from the plurality of magnetic beacons and output the location signal in response thereto.

8. The magnetic beacon and inertial sensor system according to claim 7 wherein the PIMIMU device is configured to calculate a step length of an individual based on at least one of attitude information and the location signal, the controller is configured to determine the location of the PIMIMU device based on the plurality of magnetic beacons in conjunction with the attitude information from the PIMIMU device.

9. The magnetic beacon and inertial sensor system according to claim 1 wherein the controller is configured to determine the location of the PIMIMU device based on only two of the plurality of magnetic beacons and output the location signal in response thereto.

10. The magnetic beacon and inertial sensor system according to claim 9 wherein the PIMIMU device is configured to calculate a step length of an individual based on at least one of attitude information and the location signal, the controller is configured to determine the location of the PIMIMU device based on the plurality of magnetic beacons in conjunction with the attitude information from the PIMIMU device.

11. The magnetic beacon and inertial sensor system according to claim 1 wherein the controller is configured to determine at least one of the location and the orientation of the PIMIMU device based on only one of the plurality of magnetic beacons and output the location signal in response thereto.

12. The magnetic beacon and inertial sensor system according to claim 11 wherein the PIMIMU device is configured to calculate a step length of an individual based on at least one of attitude information and the location signal, the controller is configured to determine the location of the PIMIMU device based on the plurality of magnetic beacons in conjunction with the attitude information from the PIMIMU device.

13. The magnetic beacon and inertial sensor system according to claim 1, wherein each of the plurality of magnetic beacons outputs the discrete signal at a low frequency in the range of about 1 Hz to 10,000 Hz.

14. The magnetic beacon and inertial sensor system according to claim 1 wherein the PIMIMU device is configured to output attitude information.

15. The magnetic beacon and inertial sensor system according to claim 1 wherein the location signal comprises magnetic strength and direction information.

16. The magnetic beacon and inertial sensor system according to claim 1 wherein the location signal comprises acceleration and rate of rotation information.

* * * * *